United States Patent [19]

Ilardi et al.

[11] Patent Number: 4,999,740
[45] Date of Patent: Mar. 12, 1991

[54] ELECTRONIC DEVICE FOR MANAGING AND DISSIPATING HEAT AND FOR IMPROVING INSPECTION AND REPAIR, AND METHOD OF MANUFACTURE THEREOF

[75] Inventors: Joseph M. Ilardi, Sparta, N.J.; Bernard P. Gollomp, West Lawrence, N.Y.

[73] Assignee: Allied-Signal Inc., Morris Township, Morris County, N.J.

[21] Appl. No.: 319,439

[22] Filed: Mar. 6, 1989

[51] Int. Cl.⁵ .......................... H05K 7/20; H05K 1/18
[52] U.S. Cl. ...................................... 361/386; 361/401
[58] Field of Search ............... 361/386, 401, 388, 389; 427/98

[56] References Cited

U.S. PATENT DOCUMENTS

| | | | |
|---|---|---|---|
| 3,739,232 | 6/1973 | Grossman et al. | 361/401 |
| 4,525,247 | 6/1985 | McMonagle | 427/98 |
| 4,526,810 | 7/1985 | Nesbitt | 427/98 |
| 4,829,403 | 5/1989 | Harding | 361/386 |

Primary Examiner—Roy N. Envall, Jr.
Attorney, Agent, or Firm—Donald B. Paschburg; Howard G. Massung

[57] ABSTRACT

A high circuit density printed circuit board is manufactured on a metal substrate by building a layer of photoimageable dielectric on the metal substrate and then imaging the dielectric in a manner so as to create wells for active components which are mounted directly on the metal substrate for the purpose of heat dissipation. The build up of the dielectric layer can be improved to provide circuit traces such as, for example, buried coaxial cables prior to the imaging process to achieve even higher density with conventional circuit boards.

8 Claims, 2 Drawing Sheets

ELECTRONIC DEVICE FOR MANAGING AND DISSIPATING HEAT AND FOR IMPROVING INSPECTION AND REPAIR, AND METHOD OF MANUFACTURE THEREOF

CROSS-REFERENCE TO RELATED APPLICATIONS

This application is related to application Ser. No. 432,248 concurrently filed herewith.

BACKGROUND OF THE INVENTION

This invention generally relates to a process for manufacturing printed circuit boards as well as to printed circuit boards manufactured by the process of the invention, and including mounted electronic devices with ease of inspection and repair as well as efficient dissipation of heat.

In the past, heat generated by electronic and electric components is dissipated by employing one or a combination of conduction, radiation and convection techniques. For example, cold plates that depend on the phenomenon whereby electric current is used to convey heat from a cold junction to a hot junction, e.g., Peltier effect, heat pipes that depend on the phase change of material contained in capillary type pipes or comparatively large metal bodies or structures are used to conduct heat from electric and electronic components. The aforementioned heat conduction devices may be used as part of the mounting means for components or may be located adjacent to components. To facilitate heat radiation, black metal bodies with heat radiating fins either are mounted on components or are part of the component mounting means.

To promote thermal convection, forced air moving means and the employ of fan or blower that is either an integral part of an assembly or external to an assembly with or without means for directing and/or controlling air flow are frequently employed. In addition, cooling fluids are at times used for removing heat from components and their assemblies. However, all these techniques add size, cost and complexity to circuit board assemblies and to the higher level assemblies to which they belong. Moreover, these techniques often complicate and add time to the repair and maintenance.

Under current surface mount techniques, as in the case of a pin-grid array microcircuits, soldered connections are made inaccessible for both direct inspection and test. In addition, almost all surface mount techniques cannot employ soldering equipment and techniques, for example, wave soldering, that are generally used for printed circuit boards. Instead, solder preforms, vapor reflow or other special techniques and equipment are required. The consequences are rework or repair of printed circuit board assemblies which is often impossible without specialized equipment and training. Moreover, unless the thermal coefficients of expansion are properly managed and engineered, the solder connections between the microcircuits and the printed circuit board upon which they are mounted are subject to large shearing stresses. These stresses themselves can cause the electrical connections between the micro circuits and the printed circuit board to fail or to have questionable reliability. Examples of complicated circuit board devices carrying chips and having complicated arrangements for mounting and heat dissipation are disclosed in U.S. Pat. Nos. 3,777,221, 3,918,148, 4,197,633 and 4,630,172.

Examples of devices having large scale complex integrated circuits with functional interconnections are disclosed in U.S. Pat. No. 3,795,975 and U.S. Pat. No. 4,640,010.

More recently, in U.S. Ser. No. 2,545 which was filed Jan. 12, 1987, and which disclosure is specifically incorporated by refefence herein, there is disclosed a high resolution circuit technology process for manufacturing high circuit density, copper/polyimide type, multilayer, surface mount, printed circuit boards. In the process as disclosed in the application, the process is used in conjunction with a metal substrate to produce a high circuit density printed circuit board supported by a metal substrate capable of dissipating large amounts of heat. In the basic process as disclosed the printed circuit board is generally manufactured by first applying a first layer of a radiation curable dielectric material to a substrate. A photomask is thereafter placed to define the conductor circuit patterns adjacent to the surface of the radiation curable dielectric material with the material then being exposed to a source of radiation and developed to expose those regions of the substrate where a first conductor circuit pattern is to be formed. Thereafter, the conductor circuit pattern is formed on the surface of the substrate by plating a metal coating onto those regions of the substrate covered by the exposed layer of the first layer of the curable dielectric material to provide a printed circuit board of which the first layer of the dielectric material is a structural component. The details of manufacturing circuit boards in accordance with that method is well disclosed in said copending application Ser. No. 2,545 and will not be discussed in greater detail herein. However, reference is made to that application for details not discussed and for conventional modifications of that technique which will be well known to one of ordinary skill in the art for practicing the present invention.

In accordance with the present invention the method of said copending application is utilized in conjunction with a metal substrate to produce a high circuit density printed circuit board supported by a metal substrate capable of dissipating large amounts of heat. The photoimageable polyimide dielectric is processed in such a fashion that wells for active components such as integrated circuits, i.e., ICs, are created as the circuitry is being laid down through the discussed process. The resulting package will have superior performance characteristics.

More specifically, some of the advantages derived by using the process of the copending application to produce circuitry with wells includes the fact that ICs can be placed in direct contact with the metal substrate to thereby facilitate heat dissipation. Further, the thermal coefficient of expansion of the laminated metal substrate can be tailored to match that of the device. Yet still further, the process disclosed in the copending application is compatible with conventional plated through-hole technology with minimal capital investment so that a switch over to the disclosed process of the copending application can be realized in a conventional printed circuit board shop.

In addition to the above advantages, fine line circuitry, e.g., approximately one mil, and buried coaxial lines which can be improved by using the polyimide process will greatly increase the IC packaging density and wave propagation speeds. Integrated circuits can be connected to circuitry on the printed circuit board using either tape automated bonding, including bare passivated devices, wire bonding, conventional chip carriers and chips that have leads such as gull wing or inverted "J" leads. When conventional chip carriers are used the leads can be soldered to the printed circuit board using conventional soldering methods such as flow solder.

Yet still further, since the ICs are mounted in what may be considered an inverted position, all connections between the ICs and the circuit board are observable and repairable. Visual inspection is thus facilitated and test access is provided which is not provided by current surface mount methods. The repair access feature enables the ICs to be disconnected using conventional tools and techniques and replacement can be also easily accomplished. Yet still further, by mounting the ICs in the wells or pockets, the pockets provide means for minimizing stresses and consequential strains that are induced by a high shock and vibration environment.

SUMMARY OF THE INVENTION

In accordance with the invention there is provided an improvement in a printed circuit board of the type made of photoimageable polyimide dielectric which has been manufactured by application of curable dielectric material on a substrate. In accordance with the prior art process to which the invention is an improvement, the dielectric material is photomasked in a predetermined pattern and photoimaged to obtain the desired pattern. The improvement resides in that the dielectric has been masked such that after being photoimaged, through-holes defining wells to the substrate result such that active circuit components can be mounted in the wells directly on the substrate. The substrate itself is a heat dissipating substrate for dissipating heat from active circuit components mounted in the wells directly thereon.

Specific aspects provide that active circuit components are mounted in the wells, with the substrate preferably having a coefficient of thermal expansion which matches that of the active circuit devices. Moreover, the circuit board preferably has circuit paths defined on the upper surface thereof and the active circuit devices are mounted in inverted position in the wells where the active circuit devices are electrically connected to the circuit paths whereby the electrical connections can be easily observed and repaired.

In yet still further device aspects, the circuit paths in the circuit boards comprise coaxial leads buried in the dielectric material prior to curing of the dielectric material, with the ends of the leads extending out over the surface of the dielectric for connection purposes. The active circuit devices are all interconnected in a circuit configuration at least in part through the coaxial leads. Yet still further, the invention preferably provides means for retaining the active circuit devices in fixed predetermined positions in the wells.

In the method aspects of the invention, it comprises an improvement in a method for manufacturing a printed circuit board of the type where the method comprises the steps of applying curable dielectric material onto a substrate, photomasking define patterns adjacent to surface of applied curable dielectric material and curing the material to expose the defined patterns. The improvement resides in that the masking of the dielectric is conducted in a predetermined pattern such that the photoimaging results in throughhole wells to the substrate, with the additional step of thereafter mounting active circuit components directly on the substrate in the wells or through-holes, and with the substrate being a heat dissipating substrate for dissipating heat from the active circuit components when in operation.

In yet still more specific aspects, circuit patterns are defined on the upper surface of the substrate prior to mounting the active devices in the wells with the devices in the wells then being mounted and electrically connected to the circuit paths to complete a circuit. Yet still further, prior to applying the curable dielectric to the substrate, coaxial cables can be laid on the substrate in a manner such that the ends of the coaxial cables extend over the top surface of the later applied curable dielectric. After mounting the active circuit devices in the well, electrical connection of the devices to the coaxial cables can be effected to complete the circuit.

DETAILED DISCUSSION OF THE INVENTION

Figure 1:
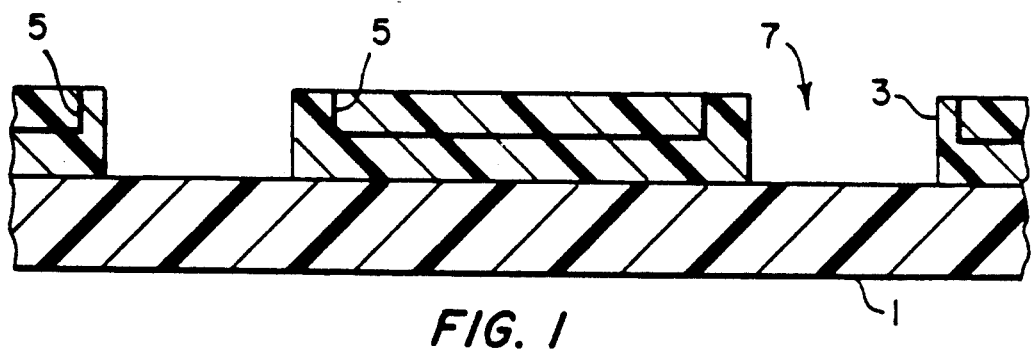
FIG. 1 is a side cross-section view of one embodiment of the basic printed circuit board including the wells in accordance with the invention.
Figure 2:
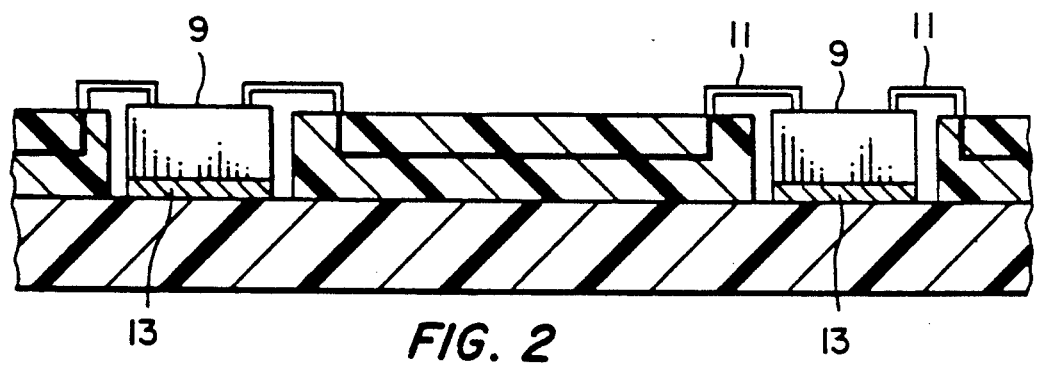
FIG. 2 is a view as in FIG. 1 showing active circuit devices mounted on the circuit board with connections to coaxial leads which are buried in the printed circuit board.

In FIG. 1 there is shown a basic printed circuit board with buried coaxial circuits made in accordance with the process of the invention. As indicated previously, the method of building the board broadly comprises the steps of applying a first layer of radiation curable dielectric material 3 to a given area of a substrate 1, preferably a laminated heat conducting substrate 1. Coaxial cables 5 are buried in the dielectric 3 with the ends of the coaxial cables 5 extending out the top prior to photomasking and exposing with radiation to create well regions 7 which extend fully such that active circuit devices 9, as shown in FIG. 2, can be mounted on the heat conducting substrate 1, typically a laminated metal substrate through the intermediary of conventional solder preforms 13 to secure the active devices 9, which are connected by leads 11 to the coaxial cables 5, within the wells 7.

Figure 3:
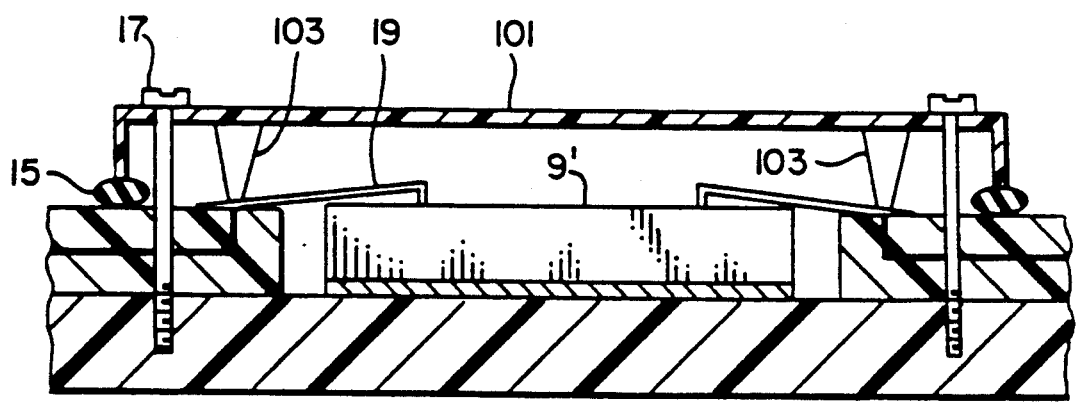
FIG. 3 shows a circuit board in accordance with the invention with a removable lid for easy replacement of circuit devices, and having a chip mounted thereon with a compression fitting tab beam connection to the coaxial leads.

FIG. 3 shows yet still another embodiment of the invention wherein the printed circuit board has a removable lid 101 for protection purposes with respect to the active circuit devices. In this case a lid 101 is provided with an O-ring seal 15 around the top surface of the board. A replaceable integrated circuit 9' is mounted within the wells and protected by the lid 101 which is also held down by a lid bolt 17 extending through the circuit board and into the substrate 1. The integrated circuit 9' is connected to the coaxial leads by means of a conventional tape automated bonding compression fitting 19 which is held down also by the compression extension 103 shown extending downward from the lid 101.

Figure 4:
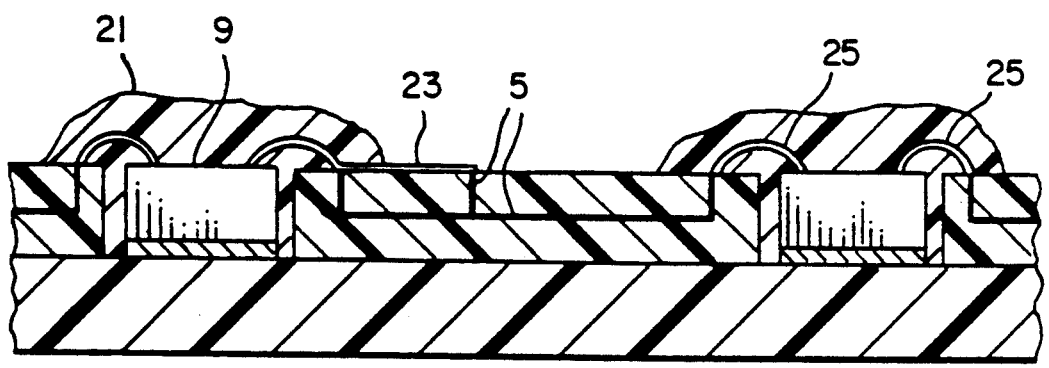
FIG. 4 shows still another embodiment in accordance with the invention showing active circuit devices enveloped by a sealing material, and showing also surface leads connected to the buried coaxial leads.

FIG. 4 shows still another embodiment of the invention, in this case showing a coaxial lead 5 extending upwards to a surface circuit trace 23 which has been laid on the printed circuit board dielectric by means of the method of said copending application Ser. No. 2,545 i.e., conventional selective plating. Wire bonds 25 connect the integrated circuits to the coaxial leads 5, and the circuits 9 themselves are protected, for example, by an epoxy glob 21 which is deposited thereon.

Figure 5:
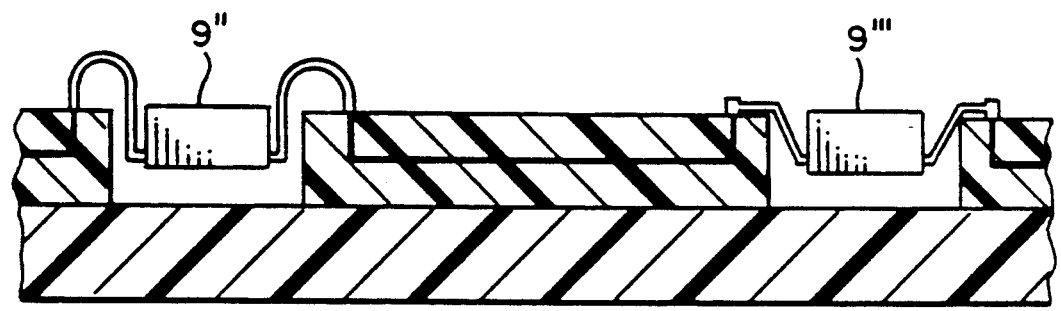
FIG. 5 is yet still another embodiment of the circuit board in accordance with the invention showing both J-lead connections and gull wing connections to the active circuit devices on the board.

FIG. 5 shows yet still another variant of the invention, in this case the surface mounted active devices 9'' or 9''' are connected to the coaxial cables by means of, in the case of the active device 9'' a conventional inverted J lead, and in the case of the active device 9''', by means of gull wing connections which are conventional in nature and well known to those of ordinary skill in this art.

While the method of manufacturing the dielectric layer and exposing it to form the wells has been described with reference to copending application Ser. No. 2,545 as exemplary thereof, it should be noted that other equivalent methods can be used, with the general requirement being that the boards are built by a building up process and a later exposing of a masked surface to form the wells and achieve the various structural features of the invention. To this end, the methods of forming the basic board can take one of several forms and is not limited to that of U.S. Ser. No. 2,545 which disclosure is incorporated by reference herein.

What is claimed is:

1. A printed circuit board comprising:
   a laminated metal substrate designed for dissipating heat;
   a curable dielectric material located on said substrate;
   wells contacting said substrate, said wells made of through holes created by masking said curable dielectric material, said wells having active circuit components mounted therein which contact said substrate; and
   the laminated metal substrate having a coefficient of thermal expansion which matches that of said active circuit components.

2. A printed circuit board as claimed in claim 1 further comprising:
   means for retaining said active circuit components in fixed predetermined positions in said wells.

3. A printed circuit board as claimed in claim 1 further comprising:
   a plurality of circuit paths defined on an upper surface of said printed circuit board, said plurality of circuit paths having an electrical connection with said active circuit components, said electrical connection being easily observable and repairable.

4. A printed circuit board as claimed in claim 1 further comprising:
   a plurality of circuit paths defined in said printed circuit board by coaxial leads buried in said curable dielectric material.

5. A printed circuit board as claimed in claim 4 further comprising:
   active circuit components having an electrical connection with said plurality of circuit paths, said electrical connection being easily observable and repairable.

6. A method for manufacturing a printed circuit board comprising the steps of:
   defining patterns on a surface of a laminated metal substrate, said patterns representing through hole wells;
   masking said surface of said substrate for said patterns;
   applying a curable dielectric material onto said surface of said substrate;
   curing said curable dielectric material so as to expose said patterns;
   mounting active circuit components directly onto said surface of said substrate in said through hole wells; and
   providing the laminated metal substrate so that said substrate has a coefficient of thermal expansion which matches that of said active circuit components.

7. A method for manufacturing a printed circuit board as claimed in claim 6 further comprising the steps of:
   defining and depositing circuit paths on said surface of said substrate prior to mounting said active circuit components directly onto said surface of said substrate in said through hole wells; and,
   electrically connecting said active circuit components to said circuit paths.

8. A method for manufacturing a printed circuit board comprising the steps of:
   defining patterns on a surface of a laminated metal substrate, said patterns representing through hole wells;
   masking said surface of said substrate for said patterns;
   applying a curable dielectric material onto said surface of said substrate;
   laying coaxial cables on said surface of said substrate in a manner such that ends of said coaxial cables extend over said curable dielectric material;
   curing said curable dielectric material so as to expose said patterns;
   mounting active circuit components directly onto said surface of said substrate in said through hole wells;
   electrically connecting said active circuit components to said coaxial cables; and
   providing the laminated metal substrate so that said substrate has a coefficient of thermal expansion which matches that of said active circuit components.

* * * * *